United States Patent
Kim

(10) Patent No.: US 7,428,168 B2
(45) Date of Patent: Sep. 23, 2008

(54) SEMICONDUCTOR MEMORY DEVICE SHARING A DATA LINE SENSE AMPLIFIER AND A WRITE DRIVER IN ORDER TO REDUCE A CHIP SIZE

(75) Inventor: Seung-Lo Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 138 days.

(21) Appl. No.: 11/478,527

(22) Filed: Jun. 30, 2006

(65) Prior Publication Data
US 2007/0070697 A1    Mar. 29, 2007

(30) Foreign Application Priority Data
Sep. 28, 2005    (KR) ...................... 10-2005-0090844
Dec. 29, 2005    (KR) ...................... 10-2005-0134011

(51) Int. Cl.
*G11C 11/34* (2006.01)
(52) U.S. Cl. ..................... 365/185.13; 365/230.03; 365/185.23
(58) Field of Classification Search ............ 365/185.13, 365/230.03, 185.23
See application file for complete search history.

(56) References Cited

U.S. PATENT DOCUMENTS

| | | | |
|---|---|---|---|
| 5,831,924 A * | 11/1998 | Nitta et al. ............. | 365/230.03 |
| 5,841,730 A | 11/1998 | Kai et al. | |
| 6,091,659 A * | 7/2000 | Watanabe et al. ...... | 365/230.03 |
| 6,310,815 B1 * | 10/2001 | Yamagata et al. ...... | 365/230.03 |
| 6,385,121 B2 * | 5/2002 | Lee ......................... | 365/230.03 |
| 6,462,998 B1 * | 10/2002 | Proebsting .................. | 365/205 |
| 6,934,214 B2 * | 8/2005 | Fujisawa et al. ........ | 365/230.03 |
| 6,990,040 B2 | 1/2006 | Ohshima et al. | |
| 2005/0030798 A1 | 2/2005 | Lim et al. | |

FOREIGN PATENT DOCUMENTS

| JP | 2001-297595 A | 10/2001 |
|---|---|---|
| JP | 2005-166245 A | 6/2005 |

\* cited by examiner

*Primary Examiner*—Tuan T. Nguyen
(74) *Attorney, Agent, or Firm*—McDermott Will & Emery LLP

(57) ABSTRACT

A semiconductor memory device includes a first and a second bank, a global data line, a first and a second data line, a data transmitter, and a switch. The global data line is configured between the first and the second banks and commonly shared by the first and the second banks. The first and the second local data lines are respectively configured in the first and the second banks. The data transmitter is configured to transmit data between the global data line and the first and the second local data lines. The switch is configured to couple the data transmitter with the first or the second local data line in response to a corresponding bank selection signal.

7 Claims, 3 Drawing Sheets

SEMICONDUCTOR MEMORY DEVICE SHARING A DATA LINE SENSE AMPLIFIER AND A WRITE DRIVER IN ORDER TO REDUCE A CHIP SIZE

FIELD OF THE INVENTION

The present invention relates to a semiconductor memory device; and, more particularly, to a semiconductor memory device sharing a data line sense amplifier and a write driver in order to reduce a chip size.

DESCRIPTION OF RELATED ARTS

A dynamic random access memory (DRAM) conventionally includes a plurality of cells. Each cell includes a cell transistor and a cell capacitor. After an active command is input, a word line connected to a gate of the cell transistor is activated and, therefore, the cell transistor is turned on. Consequently, data stored in the cell capacitor is loaded at a bit line through the cell transistor. A bit line sense amplifier amplifies the data loaded at the bit line. After a read command is input, the data amplified by the bit line sense amplifier is transmitted to a local input/output (I/O) line, a data line in a core area of the DRAM.

As density of the DRAM is increased, the size of the core area of the DRAM is also increased and, therefore, the length of the local I/O line is required to be longer than before. However, in order to maintain integrity of the DRAM, the size of the bit line sense amplifier cannot be increased. Therefore, a data line sense amplifier is included in order to amplify the data loaded at the local I/O line before transmitting to a global I/O line in a peripheral area of the DRAM. The global I/O line is commonly shared by all banks in the DRAM.

When data is input with a write command, the data is written in the cell through the global I/O line, the local I/O line, and the bit line sense amplifier. The data loaded at the global I/O line is transmitted to the local I/O line through a write driver in order to reduce line load and perform high speed operation.

That is, the DRAM includes a data line sense amplifier and a write driver. The data line sense amplifier couples a local I/O line in a core area and a global I/O line in a peripheral area for a read operation of the DRAM. The write driver couples the local I/O line in the core area and the global I/O line in the peripheral area for a write operation of the DRAM. The number of data line sense amplifiers and write drivers included in one bank is determined by a prefetch mode, i.e., number of bits prefetched by one command, and an I/O configuration of the DRAM. For example, if a DRAM employs an X16 I/O configuration and a 4-bit prefetch, the DRAM includes 64 numbers of the data line sense amplifier and the write driver in one bank. Further, if a DRAM employs an X16 I/O configuration and an 8-bit prefetch, the DRAM includes 128 numbers of the data line sense amplifiers and the write drivers in one bank.

SUMMARY OF THE INVENTION

It is, therefore, an object of the present invention to provide a semiconductor memory device that shares a data line sense amplifier and a write driver in order to reduce chip size and improve operation speed.

In accordance with an aspect of the present invention, there is provided a semiconductor memory device including a first and a second bank, a global data line, a first and a second data line, a data transmitter, and a switch. The global data line is configured between the first and the second banks and commonly shared by the first and the second banks. The first and the second local data lines are respectively configured in the first and the second banks. The data transmitter is configured to transmit a data between the global data line and the first and the second local data lines. The switch is configured to couple the data transmitter with the first or the second local data line in response to a corresponding bank selection signal.

The data transmitter includes a write driver and a data line sense amplifier. The write driver is configured to transmit data loaded at the global data line to one of the first and the second local data lines. The data line sense amplifier is configured to transmit data loaded at one of the first and the second local data lines to the global data line.

In accordance with another aspect of the present invention, there is provided a semiconductor memory device including a plurality of banks, a plurality of global data lines, and a plurality of data transmitters. The global data lines are commonly shared by the plurality of banks. Each data transmitter commonly shared by corresponding two adjacent banks in order to transmit data between the global data and the two adjacent banks. Each bank includes a plurality of local data lines and a plurality of switches corresponding to the local data lines configured to selectively couple the data transmitter with the corresponding local data line in response to a corresponding bank selection signal.

Each data transmitter includes a write driver and a data line sense amplifier. The write driver is configured to transmit data loaded at the global data line to one of local data lines respectively included in the corresponding two banks neighboring each other. The data line sense amplifier is configured to transmit data loaded at one of the local data lines respectively included in the corresponding two banks neighboring each other to the global data line.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device in accordance with the present invention will be described in detail referring to the accompanying drawings.

Figure 1:
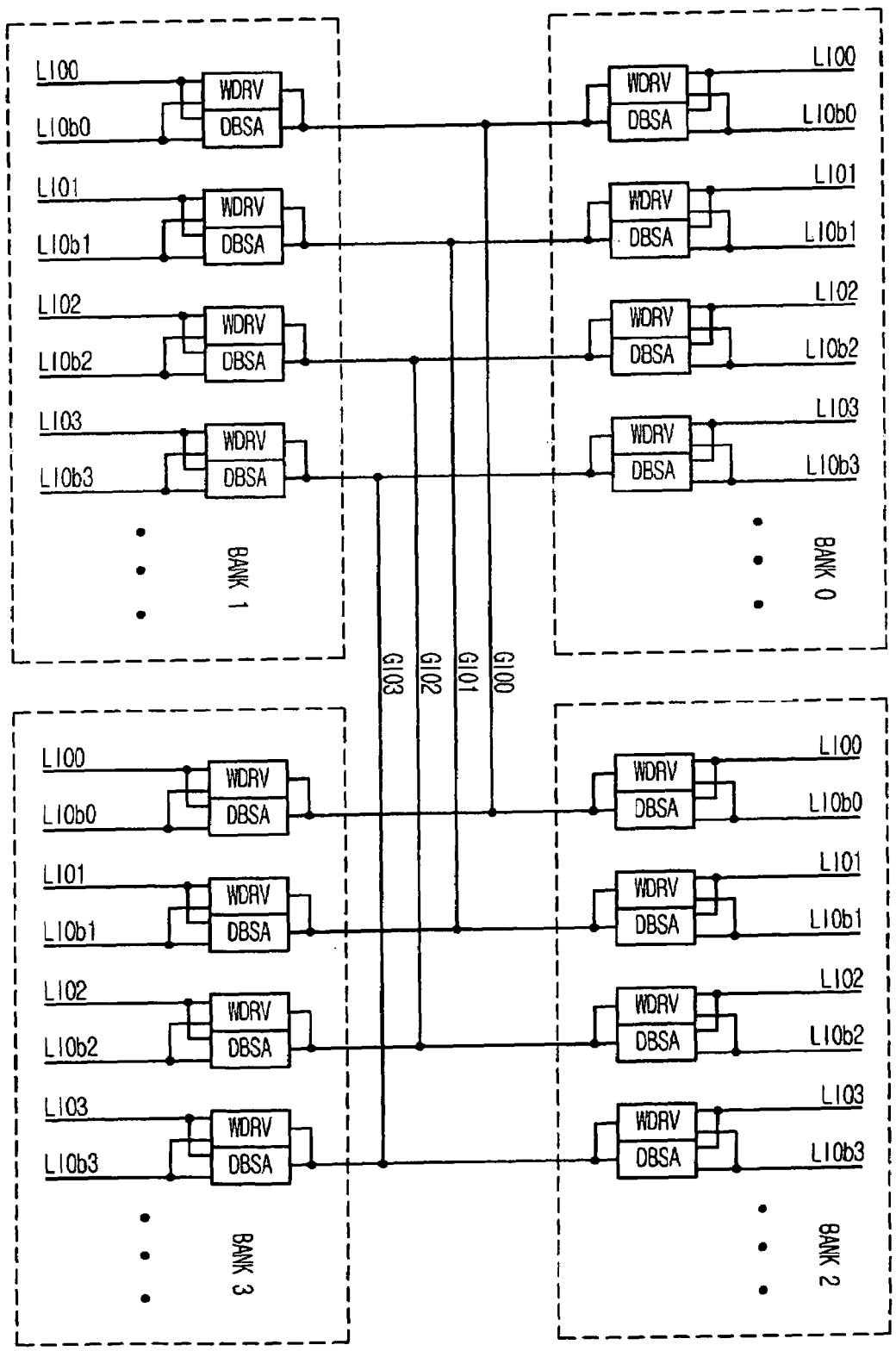
FIG. 1 is a block diagram of a semiconductor memory device in accordance with an embodiment of the present invention which includes a data line sense amplifier and a write driver.

FIG. 1 is a block diagram of a semiconductor memory device in accordance with an embodiment of the present invention which includes data line sense amplifiers and write drivers.

As shown in FIG. 1, the semiconductor memory device includes four banks BANK0 to BANK3. Each bank includes its own data line sense amplifiers DBSA and the write drivers WDRV. Therefore, when the semiconductor memory device employs an X16 I/O configuration and a 4-bit prefetch, each bank includes sixty-four data line sense amplifiers DBSA and write drivers WDRV. That is, the semiconductor memory device shown in FIG. 1 includes a total of two hundred fifty-six data line sense amplifiers DBSA and write drivers WDRV.

As density of the semiconductor memory device shown in FIG. 1 is increased and the prefetch mode is increased, the number of data line sense amplifiers DBSA and write drivers WDRV included in the semiconductor memory device is also increased. Therefore, a total chip size of the semiconductor memory device is increased.

Figure 2:
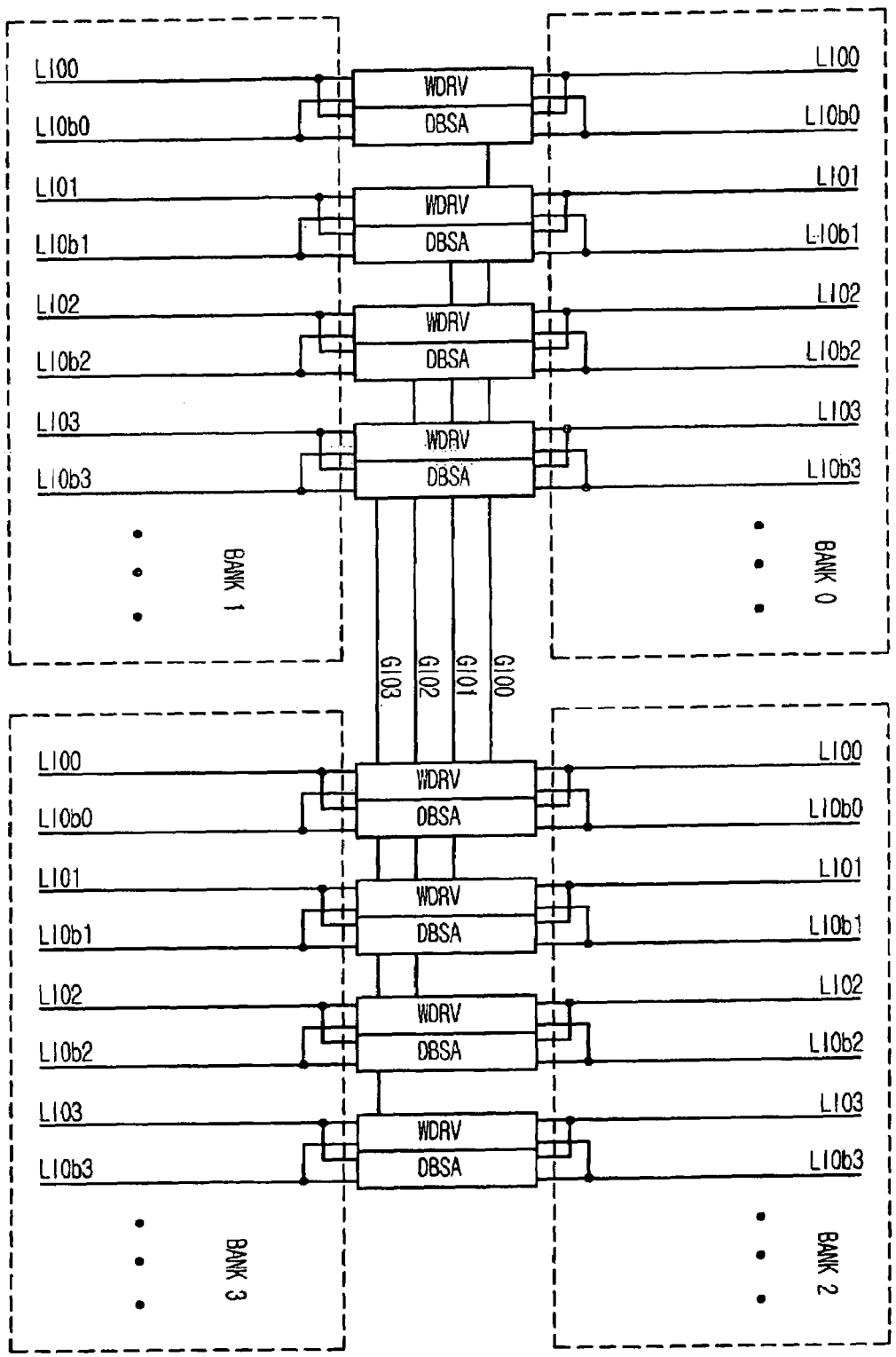
FIG. 2 is a block diagram of a semiconductor memory device in accordance with another embodiment of the present invention.

FIG. 2 is a block diagram showing a semiconductor memory device in accordance with another embodiment of the present invention.

As shown in FIG. 2, two adjacent banks in the semiconductor memory device share a write driver WDRV and a data line sense amplifier DBSA. Therefore, when the semiconductor memory device including four banks employs an X16 I/O configuration and a 4-bit prefetch, one hundred twenty-eight write drivers WDRV and data line sense amplifiers DBSA are included in the semiconductor memory device. That is, the semiconductor memory device sharing the write drivers WDRV and the data line sense amplifiers DBSA includes only half the number of write drivers WDRV and data line sense amplifiers DBSA compared with that shown in FIG. 1.

Figure 3:
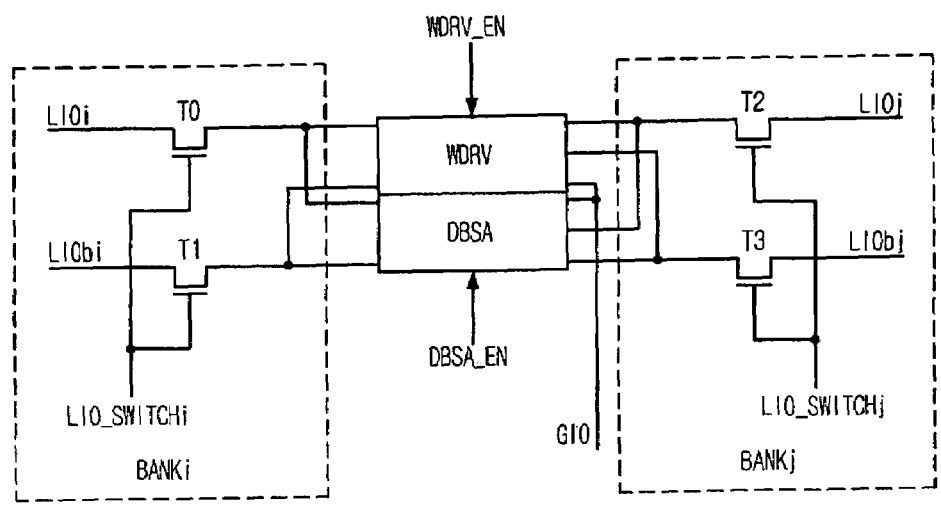
FIG. 3 is a detailed block diagram depicting a partial portion of the semiconductor memory device shown in FIG. 2.

FIG. 3 is a detailed block diagram depicting a portion of the semiconductor memory device shown in FIG. 2.

As shown in FIG. 3, a first local I/O line pair L100 and LIObj and a second local I/O line pair LIOj and LIObj, respectively included in two neighboring banks, i.e., first and second banks BANKi and BANKj, commonly share a write driver WDRV and a data line sense amplifier DBSA. The write driver WDRV selectively transmits data loaded at a global I/O line GIO to the first local I/O line pair L100 and LIObi or the second local I/O line pair LIOj and LIObj. The data line sense amplifier DBSA selectively transmits data loaded at one of the first local I/O line pair L100 and LIObi and the second local I/O line pair LIOj and LIObj to the global I/O line GIO.

Each of the first and the second banks BANKi and BANKj includes switches T0 to T3 for selectively coupling the write driver WDRV and the data line sense amplifier DBSA with the first local I/O line pair L100 and LIObi and the second local I/O line LIOj and LIObj in response to a corresponding bank selection signal LIO_SWITCHi and LIO_SWITCHj. When it is presumed that the bank selection signals LIO_SWITCHi and LIO_SWITCHj are high active signal, the switches T0 to T3 can be implemented with NMOS transistor. In other cases, the switches can be properly implemented with various logic blocks.

Figure 4:
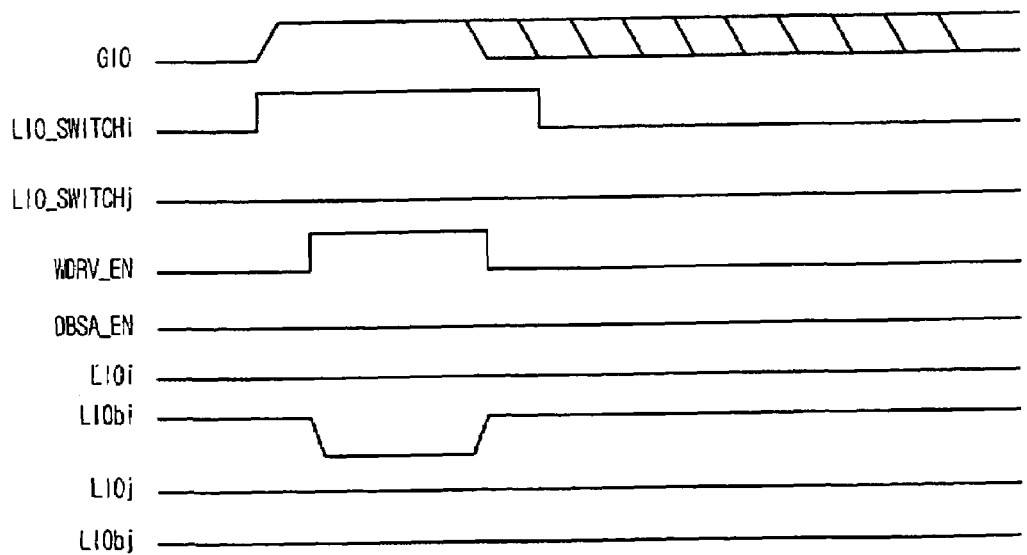
FIG. 4 is a waveform diagram demonstrating an operation of the semiconductor memory device shown in FIG. 3.

FIG. 4 is a waveform demonstrating an operation of the semiconductor memory device shown in FIG. 3 in case that a data is written in the first bank BANKi.

After a write command for the first bank BANKi is inputted, corresponding data is transmitted to the write driver WDRV through the global I/O line GIO. The switches T0 and T1 in the first bank BANKi are turned on in response to a first bank selection signal LIO_SWITCHi. The write driver WDRV is driven in response to a write drive enable signal WDRV_EN setting the drive time of the write driver WDRV. Therefore, the data loaded at the global I/O line GIO are transmitted to the first local I/O line pair L100 and LIObi.

If a read command for the first bank BANKi is input, corresponding data amplified in a bit line sense amplifier are transmitted to the first local I/O line pair L100 and LIObi. The switches T0 and T1 in the first bank BANKi are turned on in response to the first bank selection signal LIO_SWITCHi. The data line sense amplifier DBSA is driven in response to a data line sense amplifier enable signal DBSA_EN setting the drive time of the data line sense amplifier DBSA. Therefore, the data loaded at the first local I/O line pair L100 and LIObi are transmitted to the global I/O line GIO.

If a write command for the second bank BANKj is input, corresponding data are transmitted to the write driver WDRV through the global I/O line GIO. The switches T2 and T3 in the second bank BANKj are turned on in response to a second bank selection signal LIO_SWITCHj. The write driver WDRV is driven in response to the write drive enable signal WDRV_EN. Therefore, the data loaded at the global I/O line GIO are transmitted to the second local I/O line pair LIOj and LIObj.

If a read command for the second bank BANKj is input, corresponding data amplified in a bit line sense amplifier are transmitted to the second local I/O line pair LIOj and LIObj. The switches T2 and T3 in the second bank BANKj are turned on in response to the second bank selection signal LIO_SWITCHj. The data line sense amplifier DBSA is driven in response to the data line sense amplifier enable signal DBSA_EN. Therefore, the data loaded at the second local I/O line pair LIOj and LIObj are transmitted to the global I/O line GIO.

As above described, data transmission between the global I/O line GIO and the second local I/O line pair LIOj and LIObj in the second bank BANKj is the same as data transmission between the global I/O line GIO and the first local I/O line pair LIOi and LIObi in the first bank BANKi.

Consequently, the semiconductor memory device shown in FIG. 2 makes it possible to reduce the number of write drivers WDRV and data line sense amplifiers DBSA by sharing the write drivers WDRV and the data line sense amplifiers DBSA between two neighboring banks. For example, in case of a 512M DDR3, the number of word drivers WDRV and data line sense amplifiers DBSA can be reduced from 1024 to 512. Therefore, cell efficiency, a ratio of the cell area from total chip area, increases approximately 1.5%. Further, a net die, the number of chips generated from one wafer, also increases approximately 3.5% to approximately 5.7%.

Further, the number of write drivers WDRV and data line sense amplifiers DBSA connected to on global I/O line GIO is reduced and, therefore, the load on the global I/O line GIO is also reduced. Accordingly, the semiconductor memory device performs a read and a write operation with high speed.

The present application contains subject matter related to Korean patent application No. 2005-90844 and No. 2005-134011, filed in the Korean Patent Office on Sep. 28, 2005, and on Dec. 29, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a first and a second bank;
   a global data line configured between the first and the second banks and commonly shared by the first and the second banks, wherein the global data line is commonly used by input data and output data;
   a first local data line configured in the first bank;
   a second local data line configured in the second bank;
   a data transmitter configured to transmit data between the global data line and the first and the second local data lines; and a switch configured to couple the data transmitter with the first or the second local data line in response to a corresponding bank selection signal.

2. The semiconductor memory device as recited in claim 1, wherein the data transmitter includes:
- a write driver configured to transmit data loaded at the global data line to one of the first and the second local data lines; and
- a data line sense amplifier configured to transmit data loaded at one of the first and the second local data lines to the global data line.

3. The semiconductor memory device as recited in claim 2, wherein the switch includes:
- a first switch configured to connect the first local data line with the data transmitter in response to a first bank selection signal; and
- a second switch configured to connect the second local data line with the data transmitter in response to a second bank selection signal.

4. The semiconductor memory device as recited in claim 3, wherein the first and the second switches comprise NMOS transistors.

5. A semiconductor memory device, comprising:
- a plurality of banks; and
- a plurality of global data lines commonly shared by the plurality of banks, wherein each global data line is commonly used by input data and output data; and
- a plurality of data transmitters, each of which is commonly shared by two adjacent said banks to transmit data between the global data and the two adjacent banks, wherein each bank includes:
- a plurality of local data lines; and
- a plurality of switches corresponding to the local data lines configured to selectively couple corresponding data transmitters with corresponding local data lines in response to a corresponding bank selection signal.

6. The semiconductor memory device as recited in claim 5, wherein each data transmitter includes:
- a write driver configured to transmit data loaded at the global data line to one of corresponding local data lines included in the corresponding two adjacent banks; and
- a data line sense amplifier configured to transmit data loaded at one of the corresponding local data lines included in the corresponding two adjacent banks to the global data line.

7. The semiconductor memory device as recited in claim 6, wherein each switch comprises an NMOS transistor.

* * * * *

(12) EX PARTE REEXAMINATION CERTIFICATE (9250th)
United States Patent
Kim

(10) Number: US 7,428,168 C1
(45) Certificate Issued: Aug. 28, 2012

(54) SEMICONDUCTOR MEMORY DEVICE SHARING A DATA LINE SENSE AMPLIFIER AND A WRITE DRIVER IN ORDER TO REDUCE A CHIP SIZE

(75) Inventor: Seung-Lo Kim, Kyoungki-do (KR)

(73) Assignee: 658868 N.B. Inc., Saint John, NB (CA)

Reexamination Request:
No. 90/012,028, Nov. 30, 2011

Reexamination Certificate for:
Patent No.: 7,428,168
Issued: Sep. 23, 2008
Appl. No.: 11/478,527
Filed: Jun. 30, 2006

(30) Foreign Application Priority Data

Sep. 28, 2005 (KR) .................................. 10-2005-0090844
Dec. 29, 2005 (KR) .................................. 10-2005-0134011

(51) Int. Cl.
*G11C 11/34* (2006.01)
*G11C 16/04* (2006.01)
*G11C 16/06* (2006.01)
*G11C 8/00* (2006.01)

(52) U.S. Cl. .............................. 365/185.13; 365/185.23; 365/230.03

(58) Field of Classification Search ........................ None
See application file for complete search history.

(56) References Cited

To view the complete listing of prior art documents cited during the proceeding for Reexamination Control Number 90/012,028, please refer to the USPTO's public Patent Application Information Retrieval (PAIR) system under the Display References tab.

*Primary Examiner* — Robert Nasser

(57) ABSTRACT

A semiconductor memory device includes a first and a second bank, a global data line, a first and a second data line, a data transmitter, and a switch. The global data line is configured between the first and the second banks and commonly shared by the first and the second banks. The first and the second local data lines are respectively configured in the first and the second banks. The data transmitter is configured to transmit data between the global data line and the first and the second local data lines. The switch is configured to couple the data transmitter with the first or the second local data line in response to a corresponding bank selection signal.

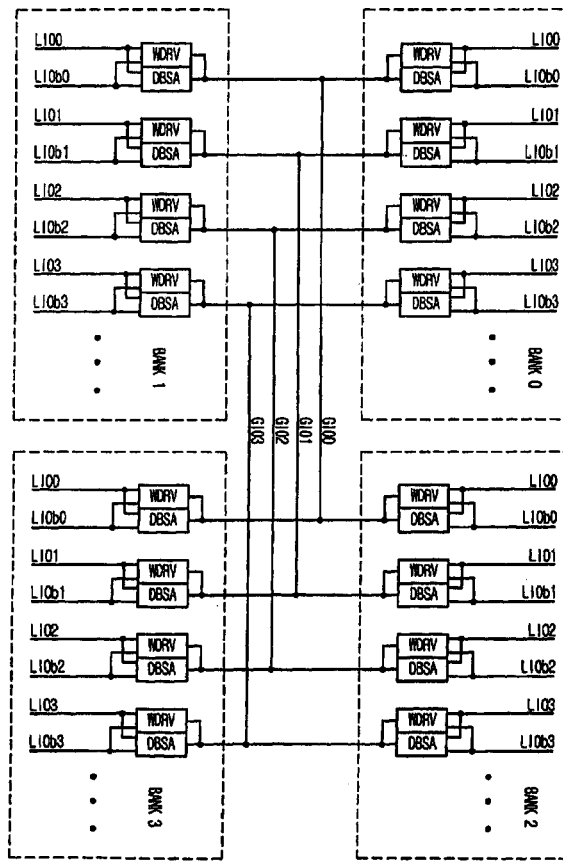

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 5 are determined to be patentable as amended.

New claims 8-13 are added and determined to be patentable.

Claims 2-4, 6 and 7 were not reexamined.

1. A semiconductor memory device, comprising:
   [a] first [and a], second, *third, and fourth* [bank] *banks*;
   a global data line configured between the first and the second banks *and between the third and the fourth banks*, and commonly shared by the first and the second banks, wherein the global data line is commonly used by input data and output data;
   a first local data line configured in the first bank;
   a second local data line configured in the second bank;
   *a third local data line configured in the third bank;*
   *a fourth local data line configured in the fourth bank;*
   a data transmitter configured to transmit data between the global data line and the first and the second local data lines; and
   a switch configured to couple the data transmitter with the first or the second local data line in response to a corresponding bank selection signal.

5. A semiconductor memory device, comprising:
   a plurality of *pairs of adjacent* banks; and
   a plurality of global data lines *between each pair of adjacent banks, each of the global data lines being* commonly shared by [the plurality] *one pair* of banks, wherein each global data line is commonly used by input data and output data; and
   a plurality of data tansmitters, each of which is commonly shared by two adjacent said banks to transmit data between the global data *lines* and the two adjacent banks,
   wherein each bank includes:
      a plurality of local data lines; and
      a plurality of switches corresponding to the local data lines configured to selectively couple corresponding data transmitters with corresponding local data lines in response to a corresponding bank selection signal.

*8. The semiconductor memory device as recited in claim 1, wherein:*
   *the global data line is further commonly shared by the third and fourth banks.*

*9. The semiconductor memory device as recited in claim 8, further comprising:*
   *a second data transmitter configured to transmit data between the global data line and the third and fourth local data lines; and*
   *a second switch configured to couple the data transmitter with the third or the fourth local data line in response to a corresponding bank selection signal.*

*10. The semiconductor device of claim 2, wherein:*
   *the global data line is further commonly shared by the third and fourth banks.*

*11. The semiconductor device of claim 10, further comprising:*
   *a second write driver configured to transmit data loaded at the global data line to the third and fourth local data lines; and*
   *a second data line sense amplifier configured to transmit data loaded at one of the third and fourth local data lines to the global data line.*

*12. The semiconductor memory device as recited in claim 5, wherein:*
   *in each bank, the plurality of local data lines comprises a pair of local data lines.*

*13. The semiconductor memory device as recited in claim 12, wherein:*
   *both local data lines in the pair of local data lines are configured to carry a High signal during an inactive state of the data transmitter corresponding to the bank; and*
   *one of the pair of local data lines is configured to carry a High signal, and the other of the pair of local data lines is configured to carry a Low signal, during an active state of said corresponding data transmitter.*

* * * * *